(12) United States Patent
Bovington

(10) Patent No.: US 10,074,955 B2
(45) Date of Patent: Sep. 11, 2018

(54) REDUNDANT HYBRID RING LASER

(71) Applicant: Oracle International Corporation, Redwood Shores, CA (US)

(72) Inventor: Jock T. Bovington, La Jolla, CA (US)

(73) Assignee: Oracle International Corporation, Redwood Shores, CA (US)

( * ) Notice: Subject to any disclaimer, the term of this patent is extended or adjusted under 35 U.S.C. 154(b) by 166 days.

(21) Appl. No.: 15/258,480

(22) Filed: Sep. 7, 2016

(65) Prior Publication Data
US 2018/0159294 A1     Jun. 7, 2018

(51) Int. Cl.
| | |
|---|---|
| *H01S 3/083* | (2006.01) |
| *H01S 5/06* | (2006.01) |
| *H01S 3/10* | (2006.01) |
| *H01S 5/30* | (2006.01) |
| *H01S 5/00* | (2006.01) |
| *H04L 12/64* | (2006.01) |
| *H01S 5/14* | (2006.01) |

(52) U.S. Cl.
CPC .......... *H01S 3/083* (2013.01); *H01S 3/10007* (2013.01); *H01S 5/005* (2013.01); *H01S 5/0601* (2013.01); *H01S 5/0617* (2013.01); *H01S 5/142* (2013.01); *H01S 5/3013* (2013.01); *H04L 12/64* (2013.01)

(58) Field of Classification Search
CPC ...... H01S 3/083; H01S 3/10007; H01S 5/005; H01S 5/0601; H01S 5/0617; H01S 5/142; H01S 5/3013; H04L 12/64
See application file for complete search history.

(56) References Cited

U.S. PATENT DOCUMENTS 9,812,845 B1 * 11/2017 Lee ........................ H01S 5/5027

OTHER PUBLICATIONS

Lee et al.; "High power and widely tunable Si hybrid external-cavity laser for power efficient Si photonics WDM links.," Opt. Express, vol. 22, No. 7, pp. 7678-7685, Apr. 2014.
Nemoto et al.; "Narrow spectral linewidth wavelength tunable laser with Si photonic-wire waveguide ring resonators," Group IV photonics, ThD4, 126-128 (2012).

(Continued)

*Primary Examiner* — Armando Rodriguez
(74) *Attorney, Agent, or Firm* — Park, Vaughan, Fleming & Dowler LLP

(57) ABSTRACT

The disclosed embodiments improve on the design of existing hybrid ring lasers by enabling a redundancy of one of the least reliable components, the III-V reflective semiconductor optical amplifier (RSOA). This allows a spare RSOA to be used to replace a failed RSOA while using the same ring mirror as the wavelength selective filter, thus reducing link down time, and eliminating the need for additional switching or multiplexing elements which add excess loss and require additional power. The result is a more reliable transmitter enabling greater scale in networking systems. In addition, this facilitates a widely tunable laser with the same outputs by utilizing two gain media comprised of different bandgap active material. Finally, multiple correlated wavelengths can be emitted from this device with two different gain materials using the same ring mirror element as reference.

21 Claims, 13 Drawing Sheets

(56) References Cited

OTHER PUBLICATIONS

Fujioka et al.; "Compact and low power consumption hybrid integrated wavelength tunable laser module using silicon waveguide resonators," J. of Lightwave Technology 28 (21), 3115-3120 (2010).

Akiyama et al.; "1-Vpp 10-Gb/s operation of slow-light silicon Mach-Zehnder modulator in wavelength range of 1 nm," Group IV photonics, WC7, 45-47 (2010).

Akiyama et al.; "Wavelength-tuning-free 10-Gb/s operation of a silicon-integrated resonantly-enhanced modulator and single-mode laser," Group IV photonics, FD3, 358-360 (2012).

Hulme et al.; "Widely tunable Vernier ring laser on hybrid silicon.," Opt. Express, vol. 21, No. 17, pp. 19718-19722, Aug. 2013.

Heck et al.; "Hybrid Silicon Photonic Integrated Circuit Technology," IEEE J. Sel. Top. Quantum Electron., vol. 19, No. 4, pp. 6100117-6100117, Jul. 2013.

\* cited by examiner

REDUNDANT HYBRID RING LASER

GOVERNMENT LICENSE RIGHTS

This invention was made with U.S. government support under Agreement No. HR0011-08-9-0001 awarded by DARPA. The U.S. government has certain rights in the invention.

BACKGROUND

Field

The disclosed embodiments generally relate to designs for semiconductor-based lasers. More specifically, the disclosed embodiments relate to the design of a redundant hybrid ring laser that provides redundancy for reflective semiconductor optical amplifier (RSOA) components of the laser.

Related Art

Silicon photonics is a promising new technology that can provide large communication bandwidth, low latency and low power consumption for inter-chip and intra-chip connections or optical links. In order to achieve low-latency, high-bandwidth optical connectivity, a number of optical components are required, including: optical modulators, optical detectors, wavelength multiplexers/demultiplexers and optical sources such as lasers.

Some recently developed optical networking systems provide large numbers (e.g., hundreds or thousands) of parallel links, which makes the reliability of every component in each of the links vital to reliability of the systems as a whole. Perhaps the single least-reliable components in these systems are the group III-V compound semiconductor devices that are used in fabricating lasers. These devices can be tested thoroughly during the manufacturing process, but long-term reliability is not guaranteed. Note that the hybrid ring laser concept provides a scalable solution to implementing highly parallel transceivers by simplifying the gain medium through use of uniform RSOA components, and replacing potential failure mechanisms of wavelength-selective mirrors known as distributed Bragg reflectors (DBRs) with silicon ring filter mirrors. However, providing additional redundancy for the RSOA components could improve the reliability of such systems considerably.

Hence, what is needed is a technique for implementing a hybrid ring laser that facilitates providing redundancy for RSOA components in such lasers.

SUMMARY

One embodiment of the present disclosure implements an integrated laser. This integrated laser includes a first reflective silicon optical amplifier (RSOA), a second RSOA, and an optical ring resonator. It also includes a symmetric power splitter comprising a reciprocal network having a first port, a second port, a third port and a fourth port, wherein light entering the first port is approximately equally split with a 90-degree phase difference between the third port and the fourth port, and wherein light entering the second port is approximately equally split with a 90-degree phase difference between the third port and the fourth port. The integrated laser also includes a number of waveguides, including: a first optical waveguide coupled between the first port and the first RSOA; a second optical waveguide coupled between the second port and the second RSOA; a third optical waveguide coupled to the third port, which channels light emanating from the third port in proximity to the optical ring resonator to cause optically coupled light to circulate in a first direction in the optical ring resonator; and a fourth optical waveguide coupled to the fourth port, which channels light emanating from the fourth port in proximity to the optical ring resonator to cause optically coupled light to circulate in a second direction, which is opposite to the first direction, in the optical ring resonator. The integrated laser additionally includes an output optical waveguide, which is optically coupled to the optical ring resonator.

In some embodiments, light emanating from the first RSOA is split by the symmetric power splitter between the third and fourth optical waveguides, which causes optically coupled light to circulate in opposite directions in the optical ring resonator, thereby causing optically coupled light to reflect back through the third and fourth optical waveguides to the symmetric power splitter, wherein the reflected light is combined and directed back to the first RSOA, and wherein no reflected light is directed back to the second RSOA due to phase cancellation. Note that the first RSOA, the first, third and fourth optical waveguides, the symmetric power splitter and the optical ring resonator collectively form a first lasing cavity for the integrated laser.

Similarly, light emanating from the second RSOA is split by the symmetric power splitter between the third and fourth optical waveguides, which causes optically coupled light to circulate in opposite directions in the optical ring resonator, thereby causing optically coupled light to reflect back through the third and fourth optical waveguides to the symmetric power splitter, wherein the reflected light is combined and directed back to the second RSOA, and wherein no reflected light is directed back to the first RSOA due to phase cancellation. In this case, the second RSOA, the second, third and fourth optical waveguides, the symmetric power splitter and the optical ring resonator collectively form a second lasing cavity for the integrated laser.

In some embodiments, only one of the first RSOA and the second RSOA is a currently active RSOA that is powered on, and the other RSOA is maintained as a spare RSOA that is not powered on. In these embodiments, the integrated laser also includes a failure-detection mechanism that detects a failure or degradation of the first and/or the second RSOA, and a switching mechanism that powers off the currently active RSOA and powers on the spare RSOA when the failure-detection mechanism detects that the currently active RSOA has failed.

In some embodiments, the gain bandwidth of the first RSOA and the gain bandwidth of the second RSOA have different overlapping frequency ranges. Moreover, only one of the first RSOA and the second RSOA is powered on at a given time depending on a desired wavelength to facilitate tuning the integrated laser over a combined frequency range that includes the overlapping frequency ranges of the first and second RSOAs.

In some embodiments, the gain bandwidth of the first RSOA and the gain bandwidth of the second RSOA have different distinct frequency ranges, and the first RSOA and the second RSOA are both powered on at the same time, whereby the integrated laser simultaneously outputs laser emissions in two different wavelength bands.

In some embodiments, the first RSOA and the second RSOA are located on one or more RSOA semiconductor chips, wherein the RSOA semiconductor chips are separate from a semiconductor chip that includes the symmetric power splitter, the first, second, third and fourth optical waveguides, the optical ring resonator and the output waveguide.

In some embodiments, the optical ring resonator comprises two optical ring resonators, which are optically coupled in a Vernier configuration that facilitates tuning the optical ring resonator over a wider spectral range than a single optical ring resonator can be tuned over.

In some embodiments, the output optical waveguide has two ends that function as two outputs of the integrated laser.

In some embodiments, the two ends of the output optical waveguide feed into two arms of a Mach-Zehnder modulator (MZM), which modulates signals received from the output optical waveguide.

In some embodiments, the integrated laser includes one or more additional output optical waveguides, which are optically coupled to the optical ring resonator, and wherein each additional output waveguide has two ends that function as outputs of the integrated laser.

In some embodiments, a modulator is coupled to each output of the integrated laser, wherein each output provides an optical carrier signal that is modulated by the associated modulator to communicate information.

In some embodiments, the symmetric power splitter comprises a directional coupler, or a multi-mode interferometer.

DETAILED DESCRIPTION

Figure 1A:
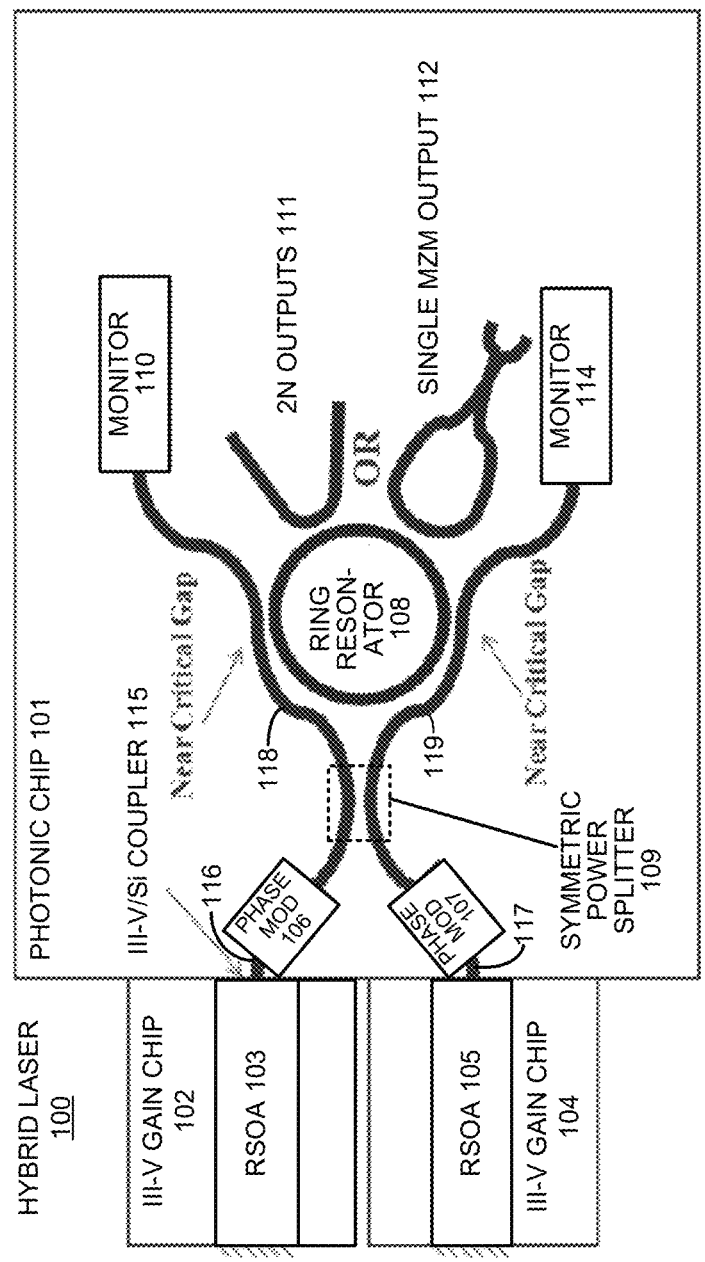
FIG. 1A illustrates an integrated laser in accordance with the disclosed embodiments.

The following description is presented to enable any person skilled in the art to make and use the present embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Redundant Hybrid Laser

The disclosed embodiments improve the design of existing hybrid ring lasers by facilitating redundancy of one of the least reliable components, the III-V reflective semiconductor optical amplifier (RSOA). This enables a spare RSOA to be used in place of a failed RSOA while using the same ring mirror as the wavelength selective filter, thereby reducing link down time, and eliminating the need for additional switching or multiplexing structures, which can add excess loss and consume additional power. The result is a more reliable transmitter that enables greater scalability in networking systems. This device can also be used to implement a widely tunable laser by utilizing two gain media comprised of different bandgap active material. Also, multiple wavelengths can be emitted from this device by using different gain materials with the same ring mirror element.

Unlike existing hybrid ring lasers, the disclosed design uses two RSOAs instead of a single RSOA, and also uses a symmetric power splitter (also referred to as a "3 dB coupler") to couple the RSOAs to the ring-based mirror in a way that provides an appropriate phase relationship to facilitate replacing a failed RSOA without additional switching structures. The phase relationship of the symmetric power splitter is such that with only the first RSOA powered on, power will not be reflected back from the ring mirror into the second RSOA, thus increasing the power loss. Instead, all of the power reflected by the ring mirror will be coupled back to the first RSOA. Hence, this system actually comprises two separate lasers, which share a single ring for wavelength selection. This system is described in more detail below.

This new hybrid laser provides significant advantages in comparison to existing hybrid lasers because it facilitates replacing the least reliable component, the III-V gain medium, with a spare III-V gain medium resulting in a significantly more reliable laser, without: (1) the need for additional switching structures; (2) the need to provide power-splitting for the laser; or (3) the need for manual maintenance operations to replace the III-V gain medium. This solution maintains all of the advantages of existing hybrid ring lasers (e.g., efficiency, high SMSR, tunability, narrow linewidth, silicon photonic integration) with increased reliability.

In a widely tunable configuration, this system has the potential to provide the world's most widely tunable semiconductor laser. Moreover, with an athermalized circuit, this system has the potential to be a WDM laser with a fixed grid, and thereby meets a critical specification for WDM links.

More specifically, FIG. 1A illustrates an exemplary redundant hybrid laser 100, which can be configured to have a single output or shared outputs in accordance with the disclosed embodiments. Hybrid laser 100 includes two separate optical gain chips, including III-V gain chip 102 and III-V gain chip 104, wherein III-V gain chip 102 includes a reflective semiconductor optical amplifier (RSOA) 103 and III-V gain chip 104 includes an RSOA 105.

When RSOA 103 is powered on, it generates an optical signal, which has an associated carrier or fundamental wavelength λ (such as 1.3 or 1.55 μm). This optical signal feeds through a III-V/Si coupler 115 into an optical waveguide 116 located in a separate photonic chip 101. Optical waveguide 116 feeds through a phase modulator 106 into an input of a symmetric power splitter 109 (also referred to as a "3 dB coupler"). Similarly, when RSOA 105 is powered on, it generates an optical signal that feeds through a III-V/Si coupler 117 into an optical waveguide 117 in photonic chip 101. Optical waveguide 117 similarly feeds through a phase modulator 107 into another input of a symmetric power splitter 109.

Symmetric power splitter 109 comprises a reciprocal network having a first port coupled to optical waveguide 116, a second port coupled to optical waveguide 117, a third port coupled to optical waveguide 118 and a fourth port coupled to optical waveguide 119. Light entering the first port is approximately equally split with a 90-degree phase difference between the third port and the fourth port, and light entering the second port is approximately equally split with a 90-degree phase difference between the third port and the fourth port.

Optical waveguide 118 channels light emanating from the third port of symmetric power splitter 109 in proximity to an optical ring resonator 108 to cause optically coupled light to circulate in a first direction in optical ring resonator 108. Similarly, optical waveguide 119 channels light emanating from the fourth port of symmetric power splitter 109 in proximity to optical ring resonator 108 to cause optically coupled light to circulate in a second direction, which is opposite to the first direction, in optical ring resonator 108.

The light circulating in optical ring resonator 108 causes optically coupled light to reflect back through optical waveguides 118 and 119 to the symmetric power splitter 109, wherein the reflected light is combined and directed back to the RSOA that originally sent the light, but not to the other RSOA that did not send the light. Note the phase relationships maintained within symmetric power splitter 109 ensure that the reflected light which exits ring resonator 108 is only directed back to the RSOA that originated the light. At the same time, phase cancellation within symmetric power splitter 109 ensures that no reflected light is directed back to the other RSOA.

Optical waveguide 118 is also coupled to a monitor 110, which can be used to determine the alignment between the laser cavity modes with a mirror resonance for ring resonator 108. Similarly, optical waveguide 119 is coupled to a monitor 114, which can also be used to determine the alignment between the laser cavity modes with a mirror resonance for ring resonator 108.

As illustrated in FIG. 1A, hybrid laser 100 can include either a single Mach-Zehnder modulator (MZM) output 112 or 2N outputs 111. In the embodiment that includes a single MZM output 112, two ends of an output optical waveguide feed into two arms of an MZM, which modulates signals received from the output optical waveguide.

In the embodiment that includes 2N outputs 111, the hybrid laser includes one or more output optical waveguides, which are optically coupled to the optical ring resonator, and which each have two ends that function as outputs of the integrated laser. If sufficient care is taken in designing these output optical waveguides, the output power will be the same across all of the outputs of all waveguides. Hence, a system that has N such optical waveguides can provide 2N balanced outputs. Note that there exists a minimum bend radius for these output waveguides that constrains the number of output waveguides that can be incorporated into the system before bending losses arise.

Figure 1B:
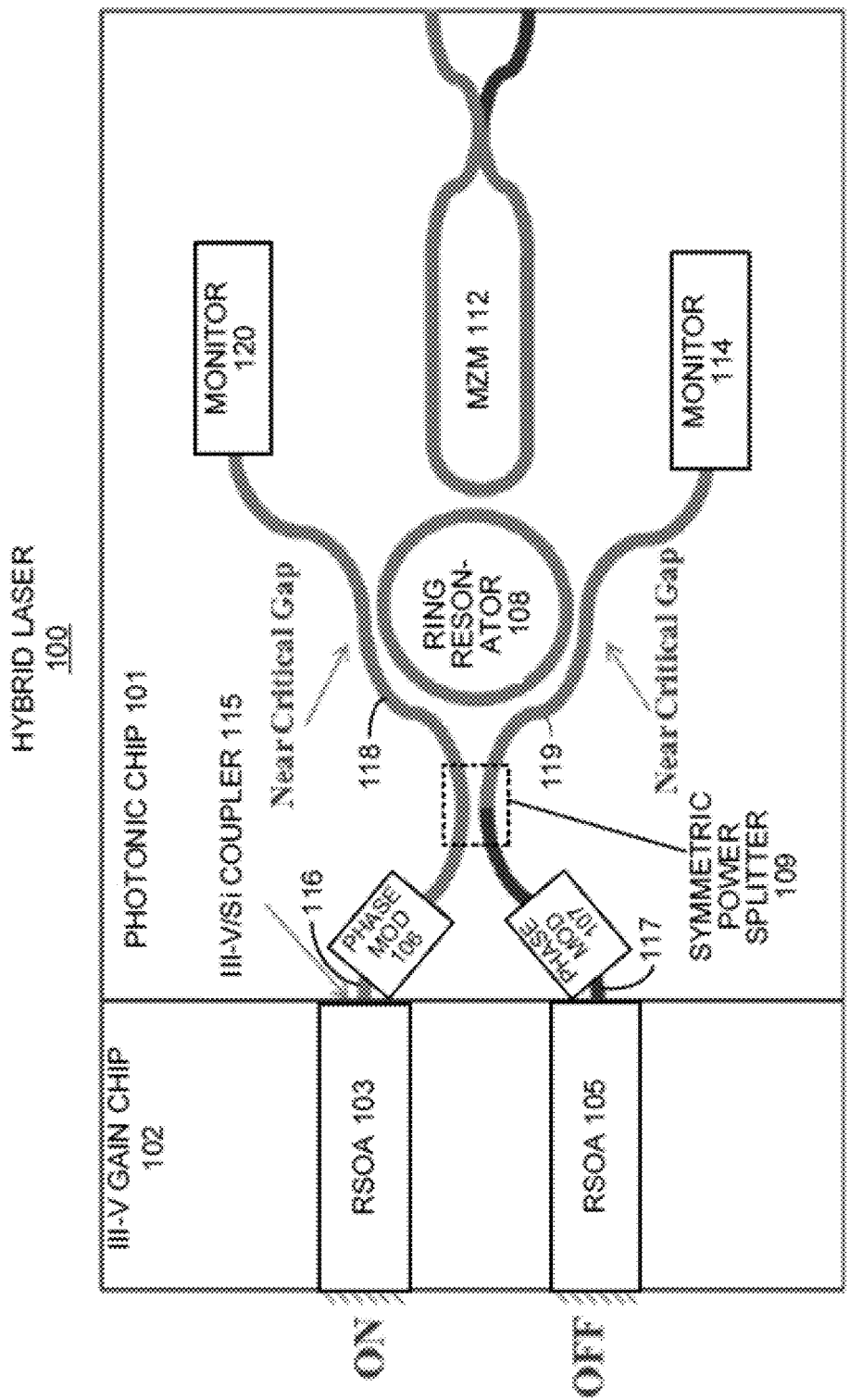
FIG. 1B illustrates a first lasing cavity for the integrated laser in accordance with the disclosed embodiments.

In the design illustrated in FIG. 1B, RSOA 103 and RSOA 105 are located in the same III-V gain chip. This differs from the design illustrated in FIG. 1A in which RSOA 103 and RSOA 105 are located in separate III-V gain chips 102 and 104. Note that locating both RSOAs 103 and 105 in the same chip can make the system easier to manufacture. However, locating RSOA 103 and RSOA 105 on separate chips can be advantageous if the wavelengths of the gain media are very different and the fabrication of quality gain material on the same wafer is a challenge, or is not possible. In the embodiment illustrated in FIG. 1B, the two output ports of ring resonator 108 are directed into the two arms of MZM 112.

During operation of the system illustrated in FIG. 1B, RSOA 103 is powered on while RSOA 105 is powered off. The light emanating from RSOA 103 flows through optical waveguide 116 and is split by symmetric power splitter 109 between optical waveguides 118 and 119. This causes optically coupled light to circulate in opposite directions in optical ring resonator 108, and thereby causes optically coupled light to reflect back through optical waveguides 118 and 119 to the symmetric power splitter 109, wherein the reflected light is combined and directed back to the RSOA 103, and wherein no reflected light is directed back to RSOA 105 due to phase cancellation. Note that RSOA 103, the optical waveguides 116, 118 and 119, symmetric power splitter 109, optical ring resonator 108 and MZM 112 collectively form a first lasing cavity for the integrated laser as is illustrated in FIG. 1B.

Figure 1C:
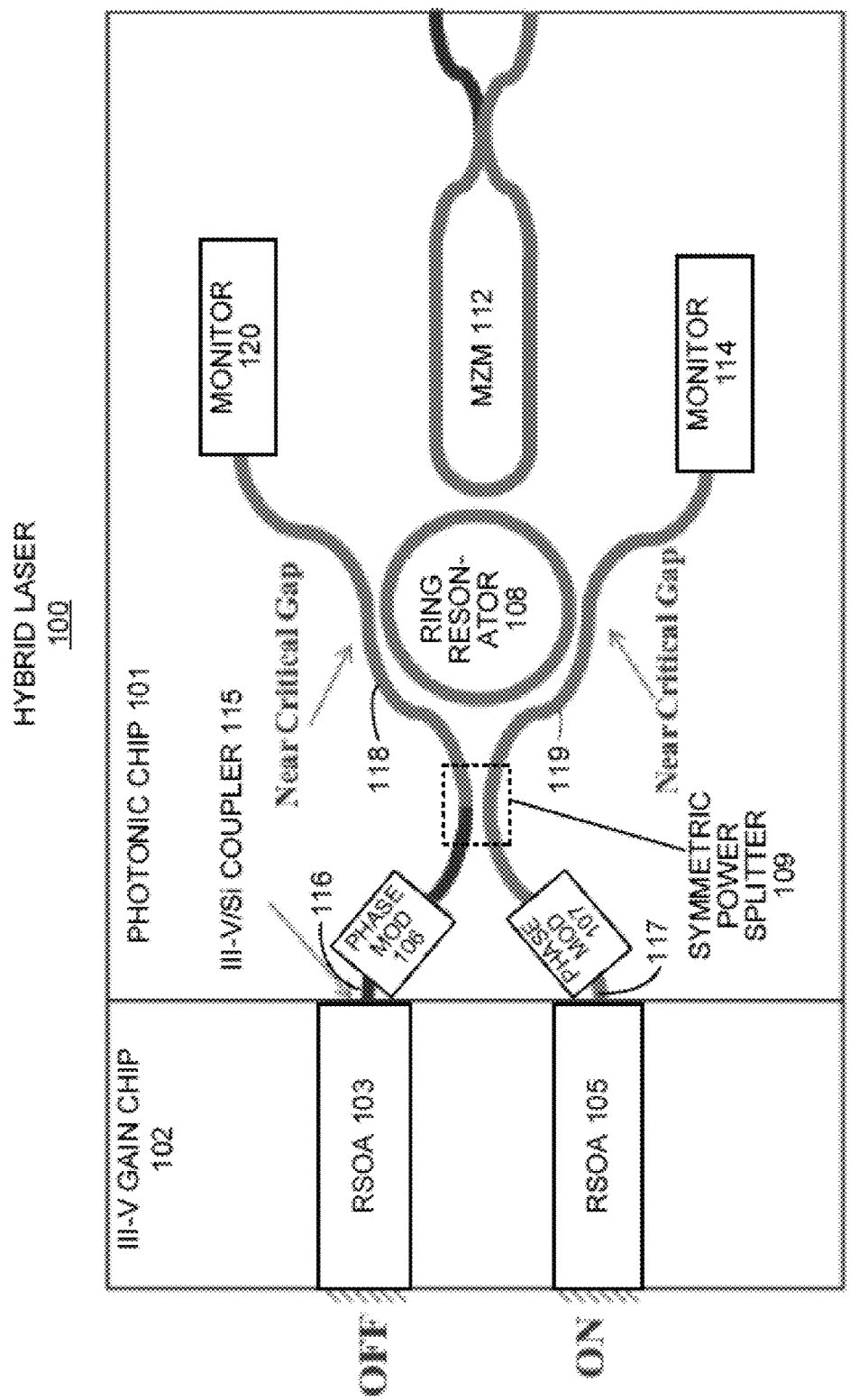
FIG. 1C illustrates a second lasing cavity for the integrated laser in accordance with the disclosed embodiments.

FIG. 1C illustrates the same system as appears in FIG. 1B, except that RSOA 105 is powered on while RSOA 103 is powered off. In this case, light emanating from RSOA 105 flows through optical waveguide 117 and is split by the symmetric power splitter 109 between optical waveguides 118 and 119. This causes optically coupled light to circulate in opposite directions in optical ring resonator 108, and thereby causes optically coupled light to reflect back through optical waveguides 118 and 119 to the symmetric power splitter 109, wherein the reflected light is combined and directed back to the RSOA 105, and wherein no reflected light is directed back to RSOA 103 due to phase cancellation. In the example illustrated in FIG. 1C, RSOA 105, the optical waveguides 117, 118 and 119, symmetric power splitter 109, optical ring resonator 108 and MZM 112 collectively form a second lasing cavity for the integrated laser.

Dual-Band Hybrid Laser

Figure 2:
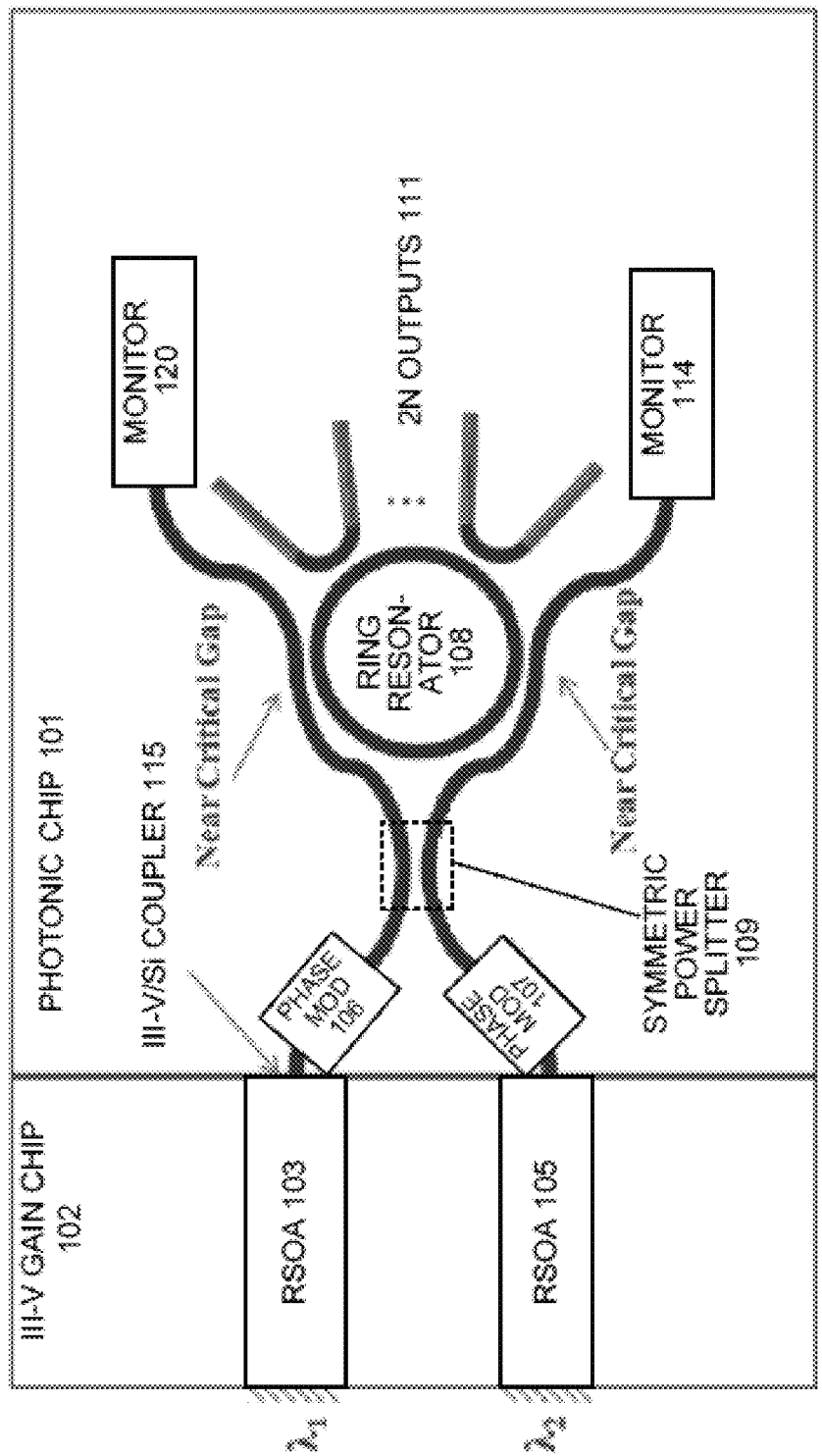
FIG. 2 illustrates how the integrated laser can be operated in a dual-band mode in an implementation that provides multiple outputs in accordance with the disclosed embodiments.
Figure 3:
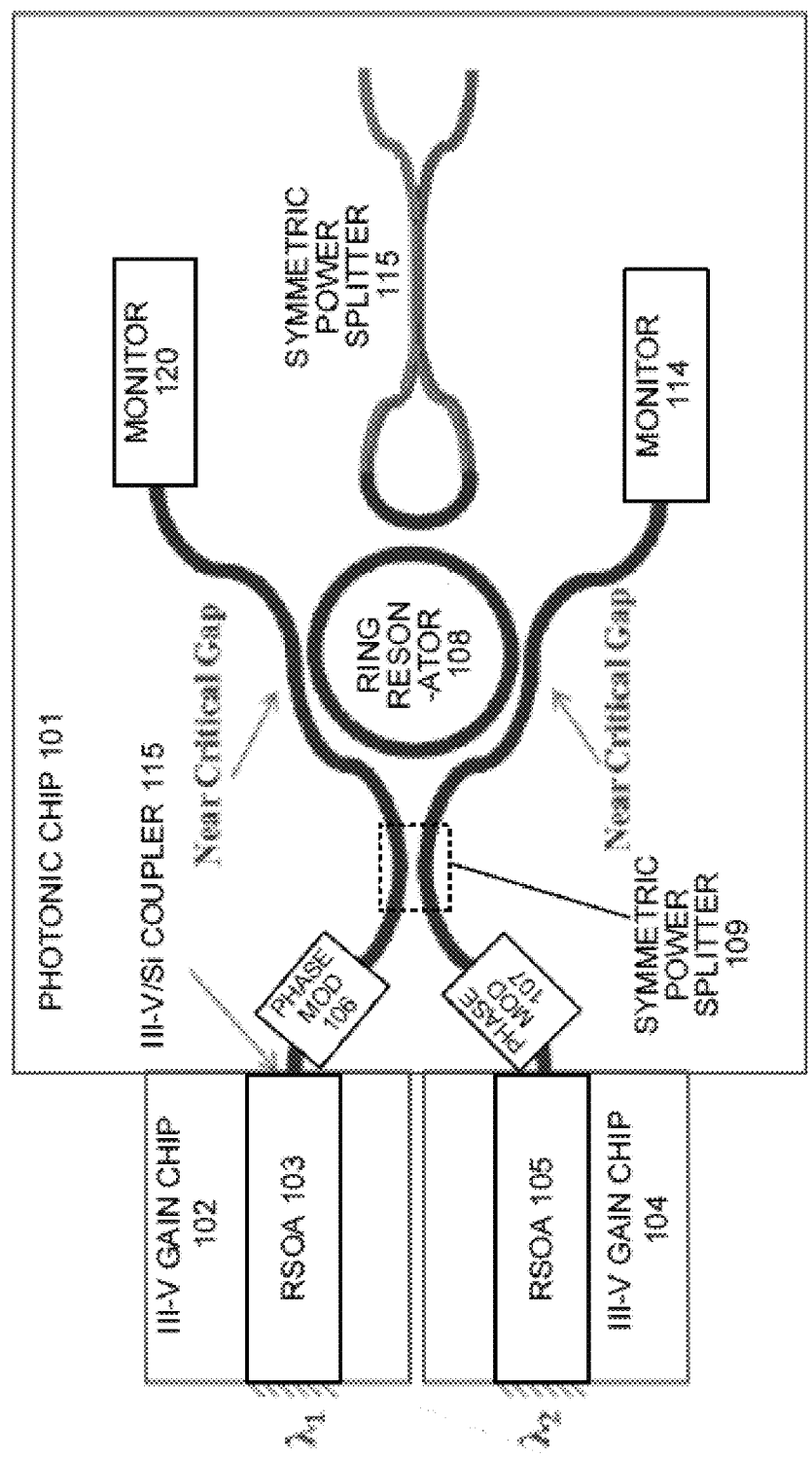
FIG. 3 illustrates how the integrated laser can be operated in a dual-band mode in an implementation that includes two separate RSOA chips in accordance with the disclosed embodiments.

FIGS. 2 and 3 illustrate dual-band variations of the hybrid laser. More specifically, FIG. 2 illustrates an implementation with a single shared III-V gain chip 102 and 2N outputs 111. In contrast, FIG. 3 illustrates an alternative implementation with separate III-V gain chips 102 and 104 and also a symmetric power splitter (3 dB coupler) 115, which is analogous to symmetric power splitter (3 dB coupler) 109 described above with reference to FIG. 1A. Symmetric power splitter (3 dB coupler) 115 produces two outputs and operates to divide the light into different colors.

Figure 5:
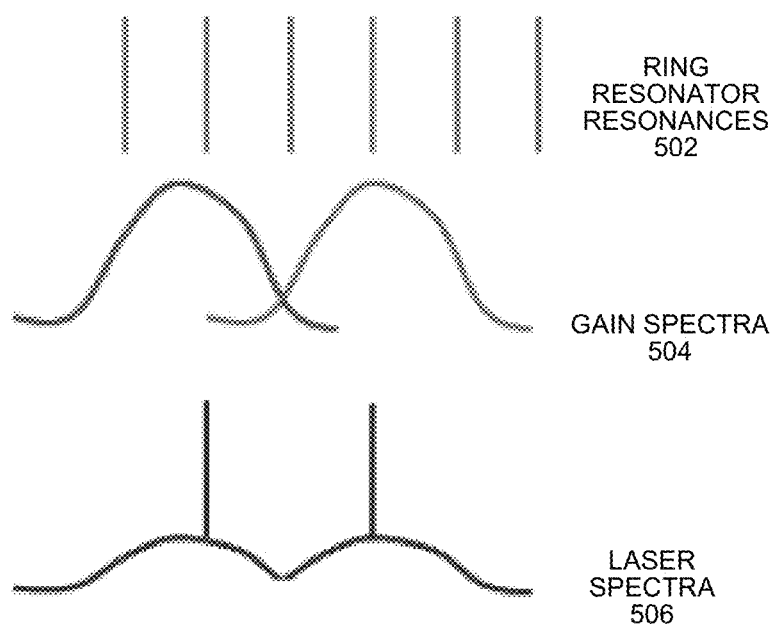
FIG. 5 illustrates gain spectra and laser spectra for a dual-band implementation of the integrated laser in accordance with the disclosed embodiments.

In these dual-band variations, rather than keeping only a single RSOA powered on, both can be kept powered on without interference if the gain bandwidth of the two RSOAs does not overlap. For example, FIG. 5 illustrates gain spectra 504 and laser spectra 506 for a dual-band implementation of the hybrid laser in accordance with the disclosed embodiments. As illustrated in FIG. 5, the combination of the wavelength-selective nature of the gain media and that of the ring resonator resonances 502 combine to provide a WDM output in each of the 2N outputs 111 illustrated in FIG. 2.

Hybrid Laser With Increased Tuning Range

This technique could also be used to increase the total tuning range of the laser. For example, in some embodiments, the gain bandwidths of two RSOAs have different overlapping frequency ranges, and only one of the two RSOAs is powered on at a given time depending on a desired wavelength for the integrated laser. This facilitates tuning the integrated laser over a combined frequency range that includes the overlapping frequency ranges of the two RSOAs.

Alternative Implementations

Figure 4A:
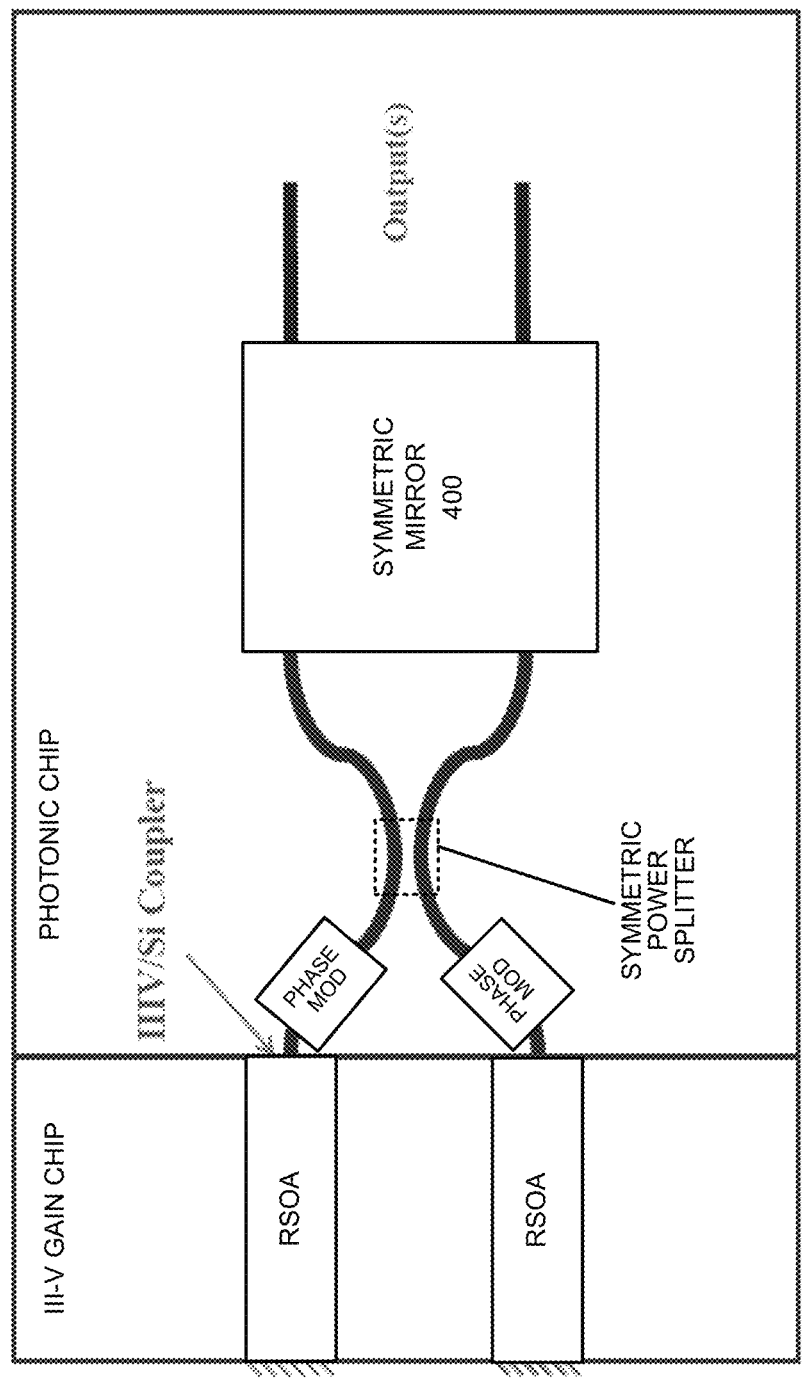
FIG. 4A illustrates how a general symmetric mirror can be used in place of an optical ring resonator in accordance with the disclosed embodiments.
Figure 4B:
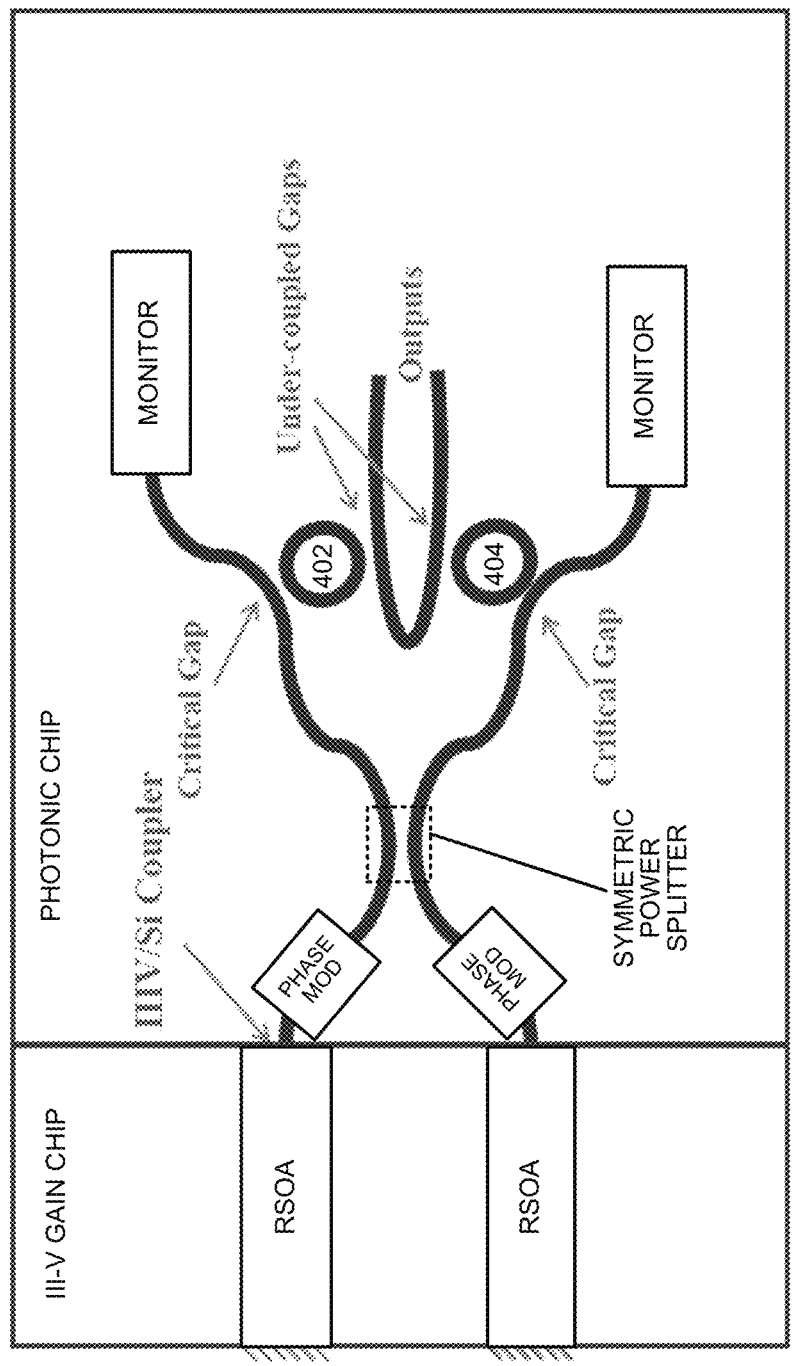
FIG. 4B illustrates how two optical ring resonators in a Vernier configuration can be used to implement a symmetric mirror in accordance with the disclosed embodiments.
Figure 4C:
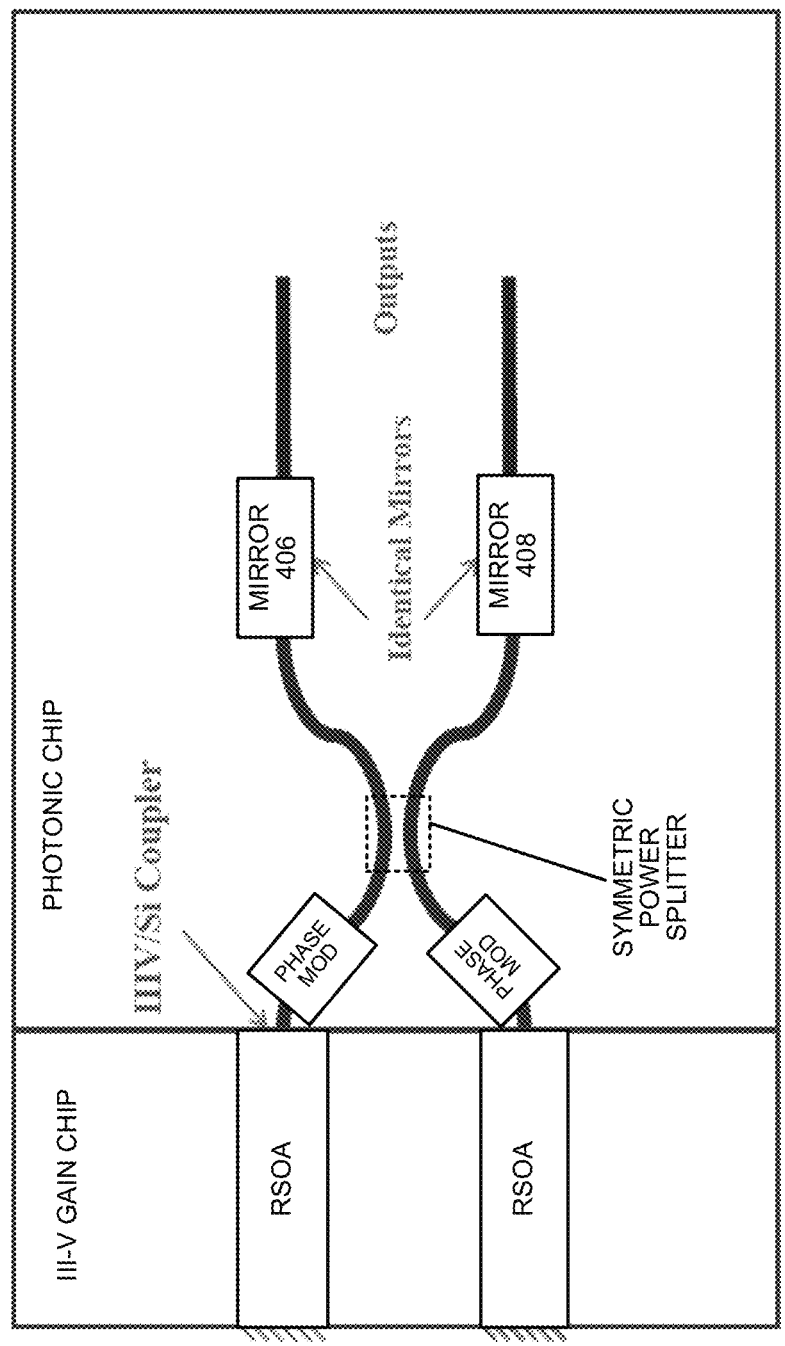
FIG. 4C illustrates how two identical mirrors can be used to implement a symmetric mirror in accordance with the disclosed embodiments.
Figure 4D:
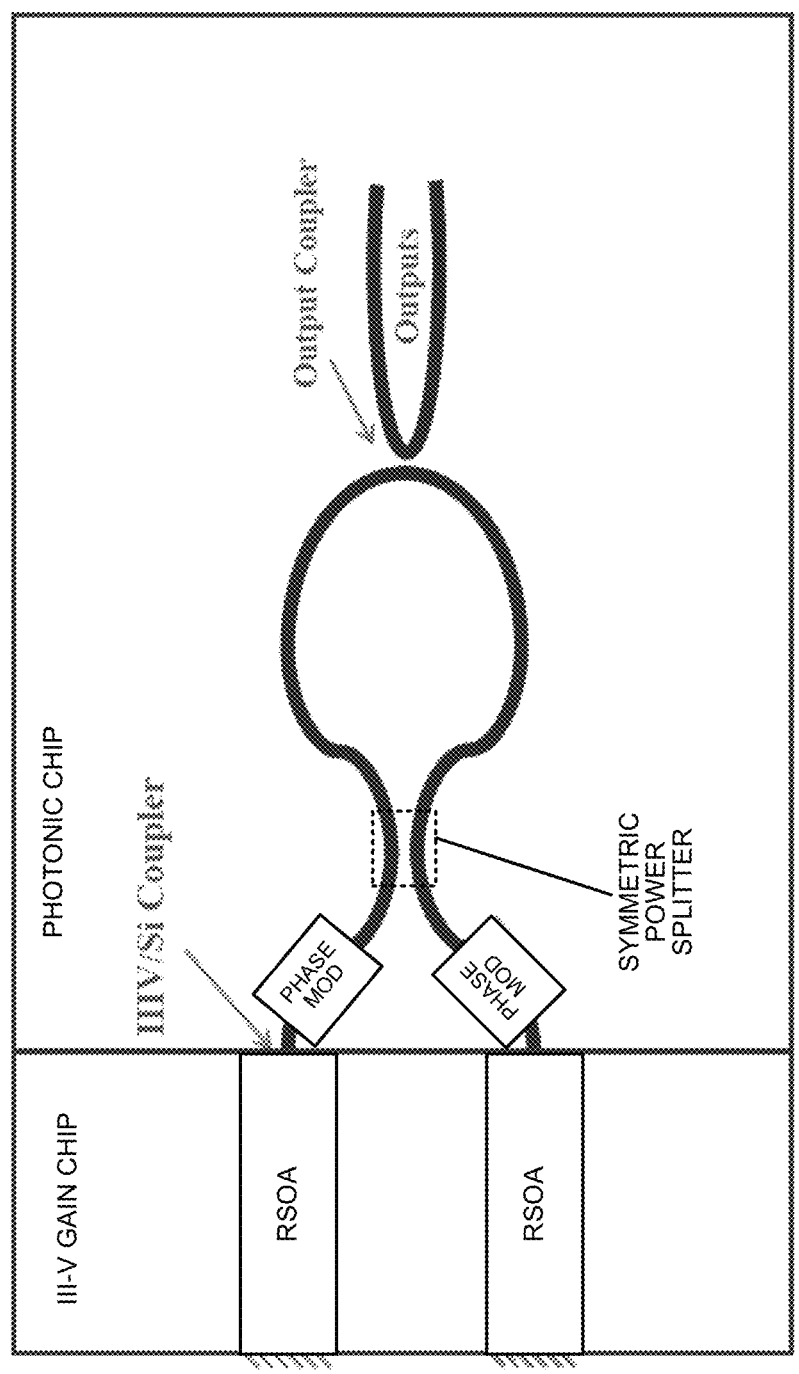
FIG. 4D illustrates another implementation for a symmetric mirror in accordance with the disclosed embodiments.

In general, the optical ring resonator 108 illustrated in FIGS. 1A, 1B, 1C, 2 and 3 can be replaced with any symmetric mirror that returns equal power and phase back to the third and forth ports of symmetric power splitter 109. This is illustrated in FIG. 4A, which displays using a symmetric mirror 400 in place of optical ring resonator 108. In some embodiments, this symmetric mirror can be implemented using two optical ring resonators, which are optically coupled together in a Vernier configuration, which facilitates tuning the optical ring resonator over a wider spectral range than a single optical ring resonator can be tuned over. For example, see FIG. 4B, which illustrates how two ring resonators 402 and 404 can be arranged in a Vernier configuration to implement such a symmetric mirror. In other embodiments, the symmetric mirror 400 can be implemented using two identical mirrors 406 and 408 as illustrated in FIG. 4C, or alternatively using a simple loop as illustrated in FIG. 4D.

Operation of the Integrated Laser

Figure 6:
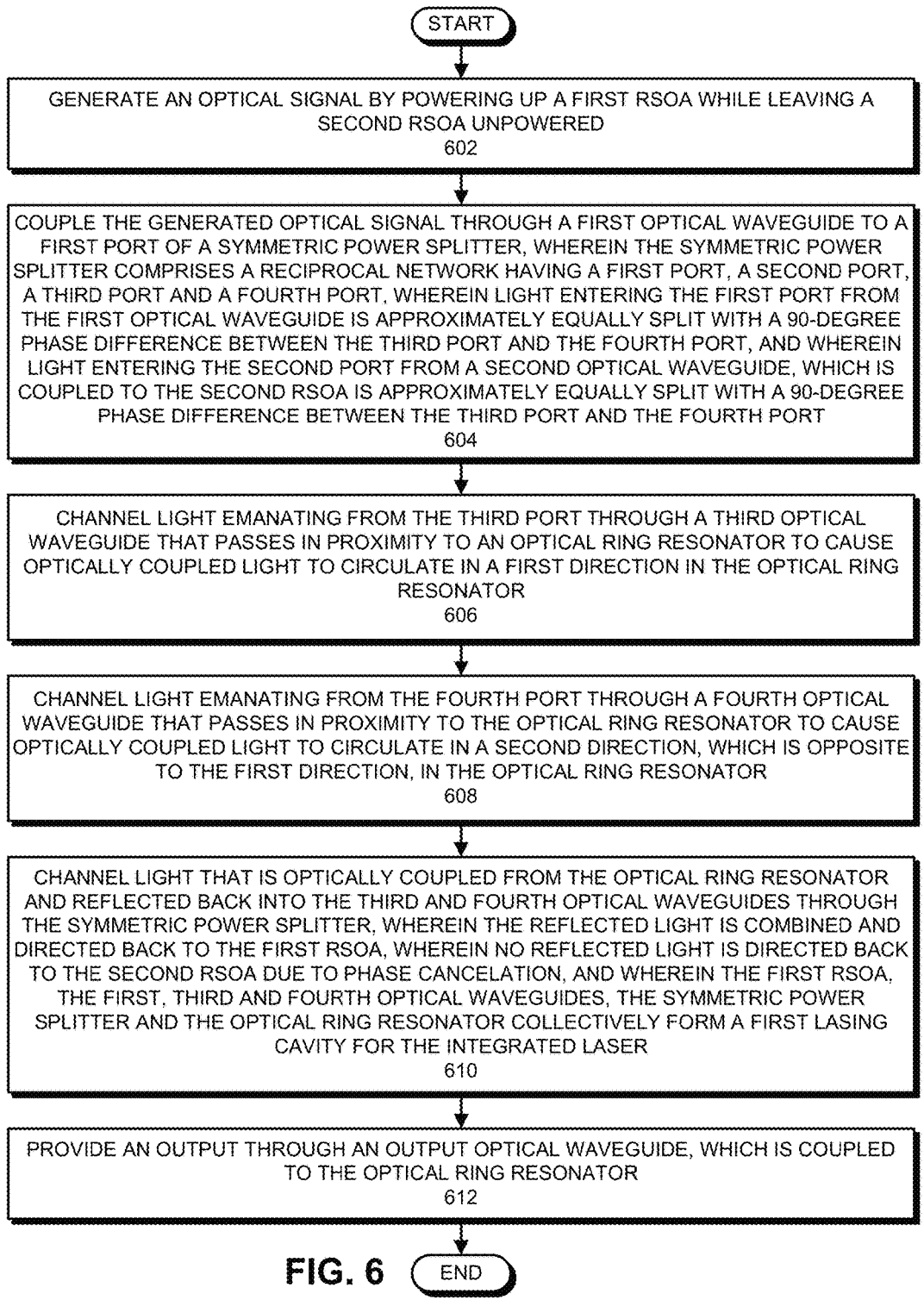
FIG. 6 presents a flow chart illustrating how a hybrid laser operates in accordance with the disclosed embodiments.

FIG. 6 presents a flow chart illustrating how a hybrid laser operates in accordance with the disclosed embodiments. During operation, the system generates an optical signal by powering up a first RSOA while leaving a second RSOA unpowered (step 602). Next, the system couples the generated optical signal through a first optical waveguide to a first port of a symmetric power splitter, wherein this symmetric power splitter comprises a reciprocal network having a first port, a second port, a third port and a fourth port, wherein light entering the first port from the first optical waveguide is approximately equally split with a 90-degree phase difference between the third port and the fourth port, and wherein light entering the second port from a second optical waveguide, which is coupled to the second RSOA is approximately equally split with a 90-degree phase difference between the third port and the fourth port (step 604).

Next, the system channels light emanating from the third port through a third optical waveguide that passes in proximity to an optical ring resonator to cause optically coupled light to circulate in a first direction in the optical ring resonator (step 606). The system also channels light emanating from the fourth port through a fourth optical waveguide that passes in proximity to the optical ring resonator to cause optically coupled light to circulate in a second direction, which is opposite to the first direction, in the optical ring resonator (step 608).

The system then channels light that is reflected back into the optical ring resonator into the third and fourth optical waveguides and then through the symmetric power splitter, wherein the reflected light is combined and directed back to the first RSOA, wherein no reflected light is directed back to the second RSOA due to phase cancellation, and wherein the first RSOA, the first, third and fourth optical waveguides, the symmetric power splitter and the optical ring resonator collectively form a first lasing cavity for the integrated laser (step 610). Finally, the system provides an output through an output optical waveguide, which is coupled to the optical ring resonator (step 612).

Figure 7:
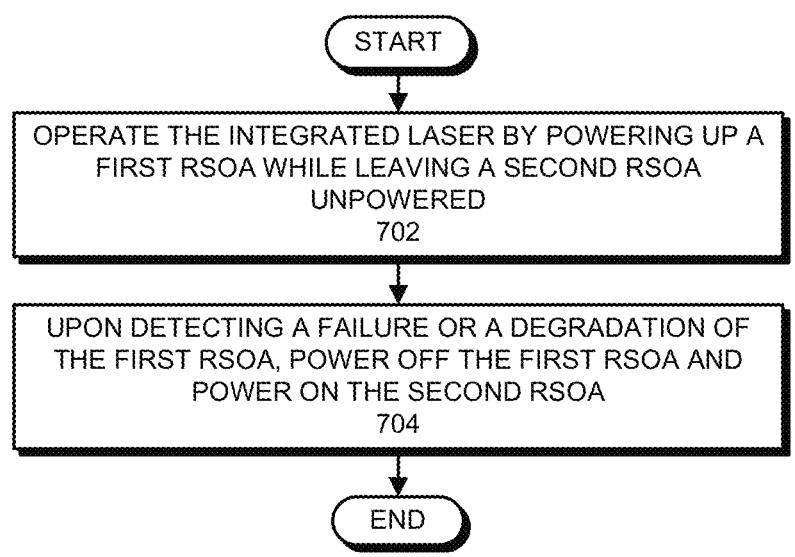
FIG. 7 presents a flow chart illustrating how a failed RSOA can be replaced in accordance with an embodiment of the present disclosure.

FIG. 7 presents a flow chart illustrating how a failed RSOA can be swapped in accordance with an embodiment of the present disclosure. At the start of this process, the system operates the integrated laser by powering up the first RSOA while leaving the second RSOA unpowered (step 702). Next, upon detecting a failure or degradation of the first RSOA, the system powers off the first RSOA and powers on the second RSOA (step 704). In some embodiments, the signaling is only inverted after the switch of RSOAs is made, thereby enabling the switching to occur between packets in most protocols.

System

Figure 8:
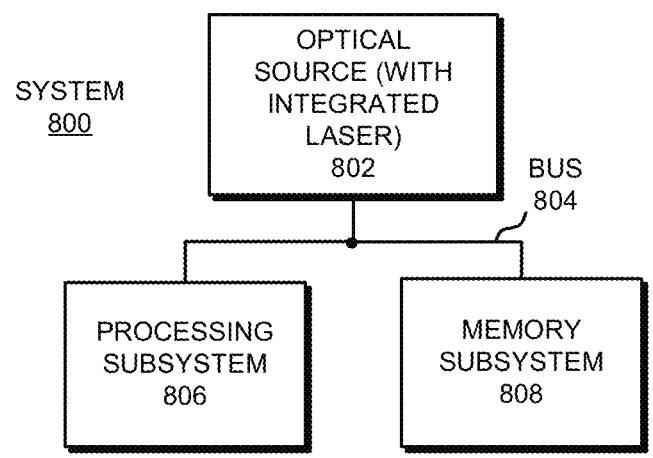
FIG. 8 illustrates a system that includes an optical source, such as an integrated laser, in accordance with an embodiment of the present disclosure.

One or more of the preceding embodiments of the integrated laser may be included in a system or device. More specifically, FIG. 8 illustrates a system 800 that includes an optical source 802 implemented using an integrated laser. System 800 also includes a processing subsystem 806 (with one or more processors) and a memory subsystem 808 (with memory).

In general, components within optical source 802 and system 800 may be implemented using a combination of hardware and/or software. Thus, system 800 may include one or more program modules or sets of instructions stored in a memory subsystem 808 (such as DRAM or another type of volatile or non-volatile computer-readable memory), which, during operation, may be executed by processing subsystem 806. Furthermore, instructions in the various modules in memory subsystem 808 may be implemented in:

a high-level procedural language, an object-oriented programming language, and/or in an assembly or machine language. Note that the programming language may be compiled or interpreted, e.g., configurable or configured, to be executed by the processing subsystem.

Components in system 800 may be coupled by signal lines, links or buses, for example bus 804. These connections may include electrical, optical, or electro-optical communication of signals and/or data. Furthermore, in the preceding embodiments, some components are shown directly connected to one another, while others are shown connected via intermediate components. In each instance, the method of interconnection, or "coupling," establishes some desired communication between two or more circuit nodes, or terminals. Such coupling may often be accomplished using a number of photonic or circuit configurations, as will be understood by those of skill in the art; for example, photonic coupling, AC coupling and/or DC coupling may be used.

In some embodiments, functionality in these circuits, components and devices may be implemented in one or more: application-specific integrated circuits (ASICs), field-programmable gate arrays (FPGAs), and/or one or more digital signal processors (DSPs). Furthermore, functionality in the preceding embodiments may be implemented more in hardware and less in software, or less in hardware and more in software, as is known in the art. In general, system 800 may be at one location or may be distributed over multiple, geographically dispersed locations.

System 800 may include: a switch, a hub, a bridge, a router, a communication system (such as a wavelength-division-multiplexing communication system), a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a work station, a mainframe computer, a blade, an enterprise computer, a data center, a tablet computer, a supercomputer, a network-attached-storage (NAS) system, a storage-area-network (SAN) system, a media player (such as an MP3 player), an appliance, a subnotebook/netbook, a tablet computer, a smartphone, a cellular telephone, a network appliance, a set-top box, a personal digital assistant (PDA), a toy, a controller, a digital signal processor, a game console, a device controller, a computational engine within an appliance, a consumer-electronic device, a portable computing device or a portable electronic device, a personal organizer, and/or another electronic device.

Moreover, optical source 802 can be used in a wide variety of applications, such as: communications (for example, in a transceiver, an optical interconnect or an optical link, such as for intra-chip or inter-chip communication), a radio-frequency filter, a bio-sensor, data storage (such as an optical-storage device or system), medicine (such as a diagnostic technique or surgery), a barcode scanner, metrology (such as precision measurements of distance), manufacturing (cutting or welding), a lithographic process, data storage (such as an optical-storage device or system) and/or entertainment (a laser light show).

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. An integrated laser, comprising:
a first reflective silicon optical amplifier (RSOA);
a second RSOA;
an optical ring resonator;
a symmetric power splitter comprising a reciprocal network having a first port, a second port, a third port and a fourth port, wherein light entering the first port is approximately equally split with a 90-degree phase difference between the third port and the fourth port, and wherein light entering the second port is approximately equally split with a 90-degree phase difference between the third port and the fourth port;
a first optical waveguide coupled between the first port and the first RSOA;
a second optical waveguide coupled between the second port and the second RSOA;
a third optical waveguide coupled to the third port, which channels light emanating from the third port in proximity to the optical ring resonator to cause optically coupled light to circulate in a first direction in the optical ring resonator;
a fourth optical waveguide coupled to the fourth port, which channels light emanating from the fourth port in proximity to the optical ring resonator to cause optically coupled light to circulate in a second direction, which is opposite to the first direction, in the optical ring resonator; and
an output optical waveguide, which is optically coupled to the optical ring resonator.

2. The integrated laser of claim 1,
wherein light emanating from the first RSOA is split by the symmetric power splitter between the third and fourth optical waveguides, which causes optically coupled light to circulate in opposite directions in the optical ring resonator, thereby causing optically coupled light to reflect back through the third and fourth optical waveguides to the symmetric power splitter, wherein the reflected light is combined and directed back to the first RSOA, wherein no reflected light is directed back to the second RSOA due to phase cancellation, and wherein the first RSOA, the first, third and fourth optical waveguides, the symmetric power splitter and the optical ring resonator collectively form a first lasing cavity for the integrated laser; and
wherein light emanating from the second RSOA is split by the symmetric power splitter between the third and fourth optical waveguides, which causes optically coupled light to circulate in opposite directions in the optical ring resonator, thereby causing optically coupled light to reflect back through the third and fourth optical waveguides to the symmetric power splitter, wherein the reflected light is combined and directed back to the second RSOA, wherein no reflected light is directed back to the first RSOA due to phase cancellation, and wherein the second RSOA, the second, third and fourth optical waveguides, the symmetric power splitter and the optical ring resonator collectively form a second lasing cavity for the integrated laser.

3. The integrated laser of claim 1,
wherein only one of the first RSOA and the second RSOA is a currently active RSOA that is powered on, and wherein the other RSOA is maintained as a spare RSOA that is not powered on; and wherein the integrated laser further comprises,
a failure-detection mechanism that detects a failure or degradation of the first and/or the second RSOA, and
a switching mechanism that powers off the currently active RSOA and powers on the spare RSOA when the failure-detection mechanism detects that the currently active RSOA has failed.

4. The integrated laser of claim 1,
wherein a gain bandwidth of the first RSOA and a gain bandwidth of the second RSOA have different overlapping frequency ranges; and
wherein only one of the first RSOA and the second RSOA is powered on at a given time depending on a desired wavelength to facilitate tuning the integrated laser over a combined frequency range that includes the overlapping frequency ranges of the first and second RSOAs.

5. The integrated laser of claim 1,
wherein a gain bandwidth of the first RSOA and a gain bandwidth of the second RSOA have different distinct frequency ranges; and
wherein the first RSOA and the second RSOA are both powered on at the same time, whereby the integrated laser simultaneously outputs laser emissions in two different wavelength bands.

6. The integrated laser of claim 1, wherein the first RSOA and the second RSOA are located on one or more RSOA semiconductor chips, wherein the RSOA semiconductor chips are separate from a semiconductor chip that includes the symmetric power splitter, the first, second, third and fourth optical waveguides, the optical ring resonator and the output waveguide.

7. The integrated laser of claim 1, wherein the optical ring resonator comprises two optical ring resonators, which are optically coupled in a Vernier configuration that facilitates tuning the optical ring resonator over a wider spectral range than a single optical ring resonator can be tuned over.

8. The integrated laser of claim 1, wherein the output optical waveguide has two ends that function as two outputs of the integrated laser.

9. The integrated laser of claim 8, wherein the two ends of the output optical waveguide feed into two arms of a Mach-Zehnder modulator (MZM), which modulates signals received from the output optical waveguide.

10. The integrated laser of claim 8, further comprising one or more additional output optical waveguides, which are optically coupled to the optical ring resonator, and wherein each additional output waveguide has two ends that function as outputs of the integrated laser.

11. The optical source of claim 8, further comprising a modulator coupled to each output of the integrated laser, wherein each output provides an optical carrier signal that is modulated by the associated modulator to communicate information.

12. The integrated laser of claim 1, wherein the symmetric power splitter comprises one of:
a directional coupler; and
a multi-mode interferometer.

13. A system, comprising:
at least one processor;
at least one memory coupled to the at least one processor; and
an integrated laser for communicating optical signals generated by the system, wherein the integrated laser includes:
a first reflective silicon optical amplifier (RSOA);
a second RSOA;
an optical ring resonator;
a symmetric power splitter comprising a reciprocal network having a first port, a second port, a third port and a fourth port, wherein light entering the first port is approximately equally split with a 90-degree phase difference between the third port and the fourth port, and wherein light entering the second port is approximately equally split with a 90-degree phase difference between the third port and the fourth port;
a first optical waveguide coupled between the first port and the first RSOA;
a second optical waveguide coupled between the second port and the second RSOA;
a third optical waveguide coupled to the third port, which channels light emanating from the third port in proximity to the optical ring resonator to cause optically coupled light to circulate in a first direction in the optical ring resonator;
a fourth optical waveguide coupled to the fourth port, which channels light emanating from the fourth port in proximity to the optical ring resonator to cause optically coupled light to circulate in a second direction, which is opposite to the first direction, in the optical ring resonator; and
an output optical waveguide, which is optically coupled to the optical ring resonator.

14. The system of claim 13,
wherein light emanating from the first RSOA is split by the symmetric power splitter between the third and fourth optical waveguides, which causes optically coupled light to circulate in opposite directions in the optical ring resonator, thereby causing optically coupled light to reflect back through the third and fourth optical waveguides to the symmetric power splitter, wherein the reflected light is combined and directed back to the first RSOA, wherein no reflected light is directed back to the second RSOA due to phase cancellation, and wherein the first RSOA, the first, third and fourth optical waveguides, the symmetric power splitter and the optical ring resonator collectively form a first lasing cavity for the integrated laser; and
wherein light emanating from the second RSOA is split by the symmetric power splitter between the third and fourth optical waveguides, which causes optically coupled light to circulate in opposite directions in the optical ring resonator, thereby causing optically coupled light to reflect back through the third and fourth optical waveguides to the symmetric power splitter, wherein the reflected light is combined and directed back to the second RSOA, wherein no reflected light is directed back to the first RSOA due to phase cancellation, and wherein the second RSOA, the second, third and fourth optical waveguides, the symmetric power splitter and the optical ring resonator collectively form a second lasing cavity for the integrated laser.

15. The system of claim 13,
wherein only one of the first RSOA and the second RSOA is a currently active RSOA that is powered on, and wherein the other RSOA is maintained as a spare RSOA that is not powered on; and
wherein the integrated laser further comprises,
a failure-detection mechanism that detects a failure or degradation of the first and/or the second RSOA, and
a switching mechanism that powers off the currently active RSOA and powers on the spare RSOA when the failure-detection mechanism detects that the currently active RSOA has failed.

16. The system of claim 13,
wherein a gain bandwidth of the first RSOA and a gain bandwidth of the second RSOA have different overlapping frequency ranges; and
wherein only one of the first RSOA and the second RSOA is powered on at a given time depending on a desired wavelength to facilitate tuning the integrated laser over a combined frequency range that includes the overlapping frequency ranges of the first and second RSOAs.

17. The system of claim 13,
wherein a gain bandwidth of the first RSOA and a gain bandwidth of the second RSOA have different distinct frequency ranges; and
wherein the first RSOA and the second RSOA are both powered on at the same time, whereby the integrated laser simultaneously outputs laser emissions in two different wavelength bands.

18. The system of claim 13, wherein the output optical waveguide has two ends that function as two outputs of the integrated laser.

19. The system of claim 18, wherein the two ends of the output optical waveguide feed into two arms of a Mach-Zehnder modulator (MZM), which modulates signals received from the output optical waveguide.

20. A method for generating optical signals, comprising:
generating an optical signal by powering up a first RSOA while leaving a second RSOA unpowered;
coupling the generated optical signal through a first optical waveguide to a first port of a symmetric power splitter, wherein the symmetric power splitter comprises a reciprocal network having a first port, a second port, a third port and a fourth port, wherein light entering the first port from the first optical waveguide is approximately equally split with a 90-degree phase difference between the third port and the fourth port, and wherein light entering the second port from a second optical waveguide, which is coupled to the second RSOA is approximately equally split with a 90-degree phase difference between the third port and the fourth port;
channeling light emanating from the third port through a third optical waveguide that passes in proximity to an optical ring resonator to cause optically coupled light to circulate in a first direction in the optical ring resonator;
channeling light emanating from the fourth port through a fourth optical waveguide that passes in proximity to the optical ring resonator to cause optically coupled light to circulate in a second direction, which is opposite to the first direction, in the optical ring resonator;
channeling light that is optically coupled from the optical ring resonator and reflected back into the third and fourth optical waveguides through the symmetric power splitter, wherein the reflected light is combined and directed back to the first RSOA, wherein no reflected light is directed back to the second RSOA due to phase cancellation, and wherein the first RSOA, the first, third and fourth optical waveguides, the symmetric power splitter and the optical ring resonator collectively form a first lasing cavity for the integrated laser; and
providing an output through an output optical waveguide, which is coupled to the optical ring resonator.

21. An integrated laser, comprising:
a first reflective silicon optical amplifier (RSOA);
a second RSOA;
a symmetric mirror having a first input port, a second input port and one or more output ports;
a symmetric power splitter comprising a reciprocal network having a first port, a second port, a third port and a fourth port, wherein light entering the first port is approximately equally split with a 90-degree phase difference between the third port and the fourth port, and wherein light entering the second port is approximately equally split with a 90-degree phase difference between the third port and the fourth port;
a first optical waveguide coupled between the first port of the symmetric power splitter and the first RSOA;
a second optical waveguide coupled between the second port of the symmetric power splitter and the second RSOA;
a third optical waveguide that channels light emanating from the third port of the symmetric power splitter into the first port of the symmetric mirror, which returns reflected light back through the third optical waveguide into the third port of the symmetric power splitter; and
a fourth optical waveguide that channels light emanating from the fourth port of the symmetric power splitter into the second port of the symmetric mirror, which returns reflected light back through the fourth optical waveguide into the fourth port of the symmetric power splitter;
wherein the one or more output ports of the symmetric mirror provide one or more outputs for the ring laser.

* * * * *